United States Patent [19]
Azuma

[11] Patent Number: 6,167,540
[45] Date of Patent: Dec. 26, 2000

[54] SEMICONDUCTOR MEMORY DEVICE AND REDUNDANT ADDRESS SELECTION METHOD THEREFOR

[75] Inventor: Mitsuhiro Azuma, Tokyo, Japan

[73] Assignee: NEC Corporation, Tokyo, Japan

[21] Appl. No.: 09/020,571

[22] Filed: Jan. 27, 1998

[30] Foreign Application Priority Data

Jan. 27, 1997 [JP] Japan ..................................... 9-012456

[51] Int. Cl.[7] .............................. G11C 29/00; G11C 7/00
[52] U.S. Cl. ........................... 714/710; 365/200; 711/173
[58] Field of Search ................................... 714/710, 711, 714/718, 723, 5; 365/200, 201; 364/268.5, 245.3, 246.3, 944, 970.1, 966.4; 711/202, 173

[56] References Cited

U.S. PATENT DOCUMENTS

| | | | |
|---|---|---|---|
| 5,163,023 | 11/1992 | Ferris et al. ............................. | 365/200 |
| 5,299,164 | 3/1994 | Takeuchi et al. ....................... | 365/201 |
| 5,452,252 | 9/1995 | Wada et al. ............................. | 365/200 |
| 5,469,390 | 11/1995 | Sasaki et al. ........................... | 365/200 |
| 5,598,373 | 1/1997 | Wada et al. ........................ | 365/230.03 |

FOREIGN PATENT DOCUMENTS

| | | |
|---|---|---|
| 2-141997 | 5/1990 | Japan . |
| 2-161699 | 6/1990 | Japan . |
| 4-349298 | 12/1992 | Japan . |

*Primary Examiner*—Trinh L. Tu
*Attorney, Agent, or Firm*—Sughrue, Mion, Zinn, Macpeak & Seas, PLLC

[57] ABSTRACT

In a semiconductor memory device including a normal memory constituted by a plurality of normal memory cells and a redundant memory constituted by a plurality of redundant memory cells, a predecoder decodes an address signal and outputs a corresponding address selection signal to an array interconnection. A normal address decoder selects a normal memory cell in the normal memory on the basis of an address selection signal from the predecoder. A redundant address decoder selects a redundant memory cell in the redundant memory on the basis of an address selection signal from the predecoder. When a defective normal memory cell in the normal memory is designated by the address signal, a control unit outputs, to the predecoder, an inactivating signal for inactivating the normal memory and a redundant memory cell selection signal for selecting the redundant memory cell in the redundant memory in place of the defective normal memory cell in the normal memory. The predecoder outputs an address selection signal corresponding to the redundant memory cell selection signal from the control unit to the array interconnection on the basis of the inactivating signal and the redundant memory cell selection signal from the control unit.

4 Claims, 8 Drawing Sheets

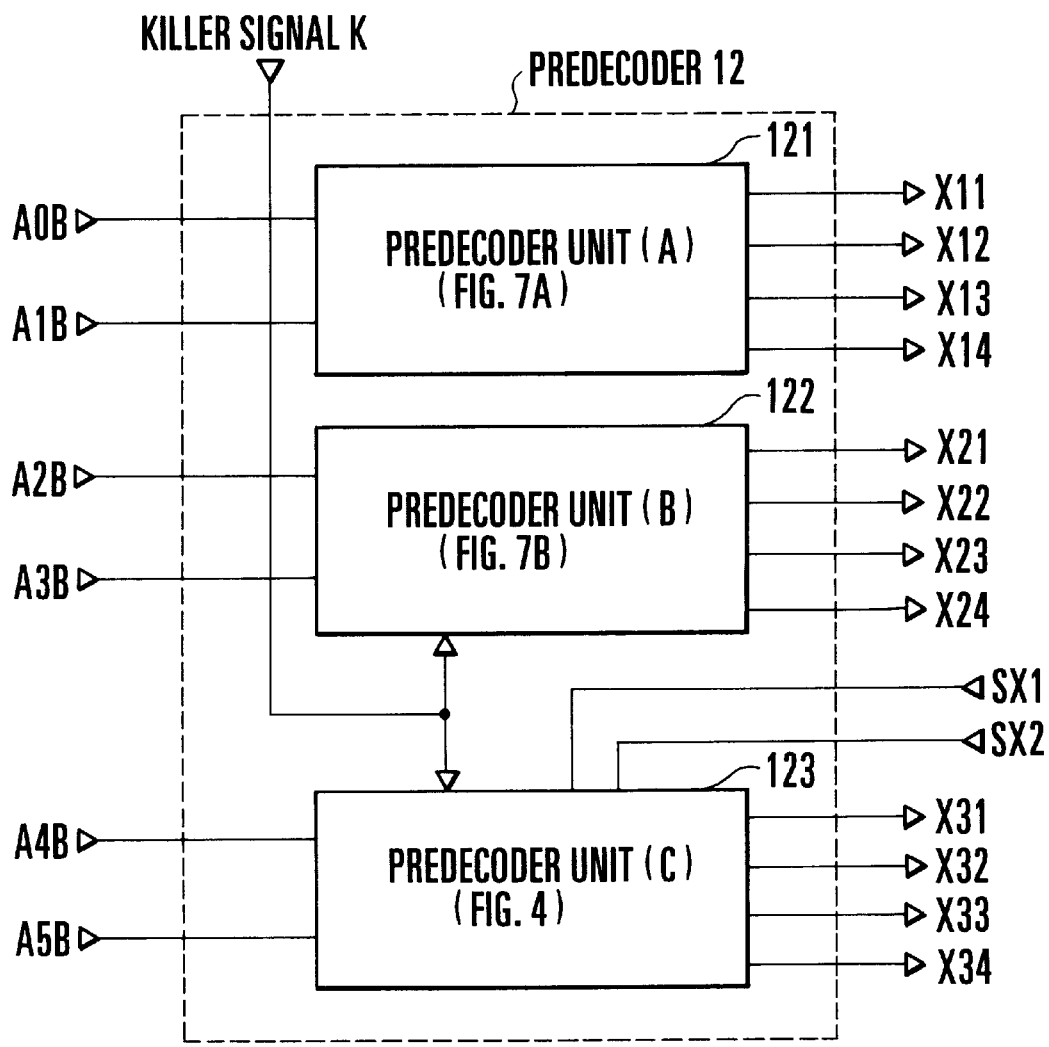
F I G. 2

SEMICONDUCTOR MEMORY DEVICE AND REDUNDANT ADDRESS SELECTION METHOD THEREFOR

BACKGROUND OF THE INVENTION

The present invention relates to a semiconductor memory device, and more particularly, to a semiconductor memory device having a redundant memory, and more specifically, to a redundant address selection apparatus for designating a redundant memory cell.

In a conventional semiconductor memory device having a redundant memory, when a normal memory cell is defective, an address not for the defective normal memory cell but for the redundant memory is selected.

FIG. 5 shows the conventional semiconductor memory device having a redundant memory. In FIG. 5, a predecoder 62 decodes row address signal bits A0B to A5B and outputs address selection signal bits X11 to X14, X21 to X24, and X31 to X34 to array interconnections (to be described later). A normal address decoder 63 outputs a normal cell word for designating a specific normal memory cell array of a normal memory 64 on the basis of the address selection signal bits X11 to X14, X21 to X24, and X31 to X34 on the array interconnections.

The address (defective address) of the defective normal memory cell which has been found in the wafer test process is programmed in a program circuit 61. If an address signal for designating the defective address is input, the program circuit 61 outputs an inactivating signal called a killer signal K for setting the normal memory cell in the normal memory 64 in a nonselection state and simultaneously outputs redundant address signals SX1 and SX2 to select redundant memory cells in a redundant memory 66 in place of the defective normal memory cell.

FIG. 6 shows the arrangement of the predecoder 62. Referring to FIG. 6, the predecoder 62 comprises three predecoder units 621 (A), 622 (B), and 623 (C). Each of the predecoder units 621 to 623 receives two bits of the six row address signal bits A0B to A5B and outputs the four address selection signal bits X1 to X14, X21 to X24, or X31 to X34 to the array interconnections.

As shown in FIGS. 7A and 7B, these predecoder units 621 to 623 are constituted by logic circuits comprising a plurality of logic gates for receiving the address signal bits A0B to A5B. The predecoder unit 622 is constituted by a plurality of inverters and NOR gates, as shown in FIG. 7B. The predecoder unit 622 calculates the logic between the row address signal bits A2b and A3B and the killer signal K to inactivate the normal memory 64. In other words, the predecoder unit controls the normal address decoder 63 to set the normal memory cell in the normal memory 64 in a nonselection state. Reference numeral 622a denotes an arithmetic circuit for determining selection of the normal memory 64 or a redundant memory 66 on the basis of the killer signal K.

More specifically, when the normal memory cell in the normal memory 64 is to be selected, the program circuit 61 sets the killer signal K at "H" level, and the outputs X21 to X24 from the predecoder unit 622 are set at values determined by the row address signal bits A2B and A3B. When the normal memory cell in the normal memory 64 is to be set in the nonselection state, the killer signal K of "L" level is input to the predecoder unit 622, and all the outputs X21 to X24 are set at "H" level independently of the values of the corresponding row address signal bits A2B and A3B.

FIG. 8 shows the arrangements of the normal address decoder 63 and a redundant address decoder 65 and their relationship with the array interconnections. In FIG. 8, the array interconnections comprise normal address selection signal lines 68 corresponding to the address selection signal bits X11 to X14, X21 to X24, and X31 to X34 from the three predecoder units 621 to 623, and redundant address selection signal lines 69 corresponding to the redundant address selection signals SX1 and SX2 output from the program circuit 61.

The normal address decoder 63 has a plurality of NOR gates 631i each of which receives one output from each of the three predecoder units 621 to 623. In response to the outputs from the NOR gates 631i, memory cell word drives (WD) 632i corresponding to the normal memory cell arrays designated by the row address signal bits A0B to A5B are driven, so normal cell words are output to the normal memory 64.

When the redundant memory 66 is to be selected, since all the four outputs X21 to X24 from the predecoder unit 622 are set at "H" level, all the NOR gates 631i constituting the normal address decoder 63 output signals of "L" level. With this operation, the normal memory 64 is not selected but inactivated. At this time, the redundant address selection signals SX1 and SX2 output from the program circuit 61 are input to the redundant address decoder 65 through the redundant address selection signal lines 69.

In the redundant address decoder 65, redundant memory cell word drives (RWD) 652a and 652b are driven on the basis of the redundant address selection signals SX1 and SX2 obtained from the redundant address selection signal lines 69, so redundant cell (RED) words 1 and 2 are output to the redundant memory 66. With this operation, predetermined redundant memory cell arrays of the redundant memory 66 are selected.

In the conventional semiconductor memory device, the redundant address selection signal lines 69 for sending the redundant address selection signals SX1 and SX2 which are output from the program circuit 61 to the redundant address decoder 65 to select redundant addresses must be arranged to the array interconnections in addition to the normal address selection signal lines 68. For this reason, as the number of redundant memory cells increases, the number of redundant address selection signal lines 69 also increases. Consequently, the number of array interconnections increases, resulting in an increase in chip area.

SUMMARY OF THE INVENTION

It is an object of the present invention to provide a semiconductor memory device and a redundant address selection apparatus therefor, which reduce the number of interconnections for redundant address selection signals in array interconnections to reduce the chip size.

In order to achieve the above object, according to the present invention, there is provided a semiconductor memory device comprising a normal memory constituted by plurality of normal memory cells, a redundant memory constituted by a plurality of redundant memory cells, a predecoder for decoding an address signal and outputting a corresponding address selection signal to an array interconnection, a normal address decoder for selecting a normal memory cell in the normal memory on the basis of an address selection signal sent from the predecoder through the array interconnection, a redundant address decoder for selecting a redundant memory cell in the redundant memory on the basis of an address selection signal sent from the predecoder through the array interconnection, and control means for, when a defective normal memory cell in the normal memory is designated by the address signal, outputting, to the predecoder, an inactivating signal for inactivating the normal memory and a redundant memory cell selection signal for selecting the redundant memory cell in the redundant memory in place of the defective normal memory cell in the normal memory, wherein the predecoder outputs an address selection signal corresponding to the redundant memory cell selection signal from the control means to the array interconnection on the basis of the inactivating signal and the redundant memory cell selection signal from the control means.

BRIEF DESCRIPTION OF THE DRAWINGS

FIG. 2 is a block diagram of a predecoder shown in FIG. 1;

DESCRIPTION OF THE PREFERRED EMBODIMENT

The present invention will be described below in detail with reference to the accompanying drawings.

Figure 1:
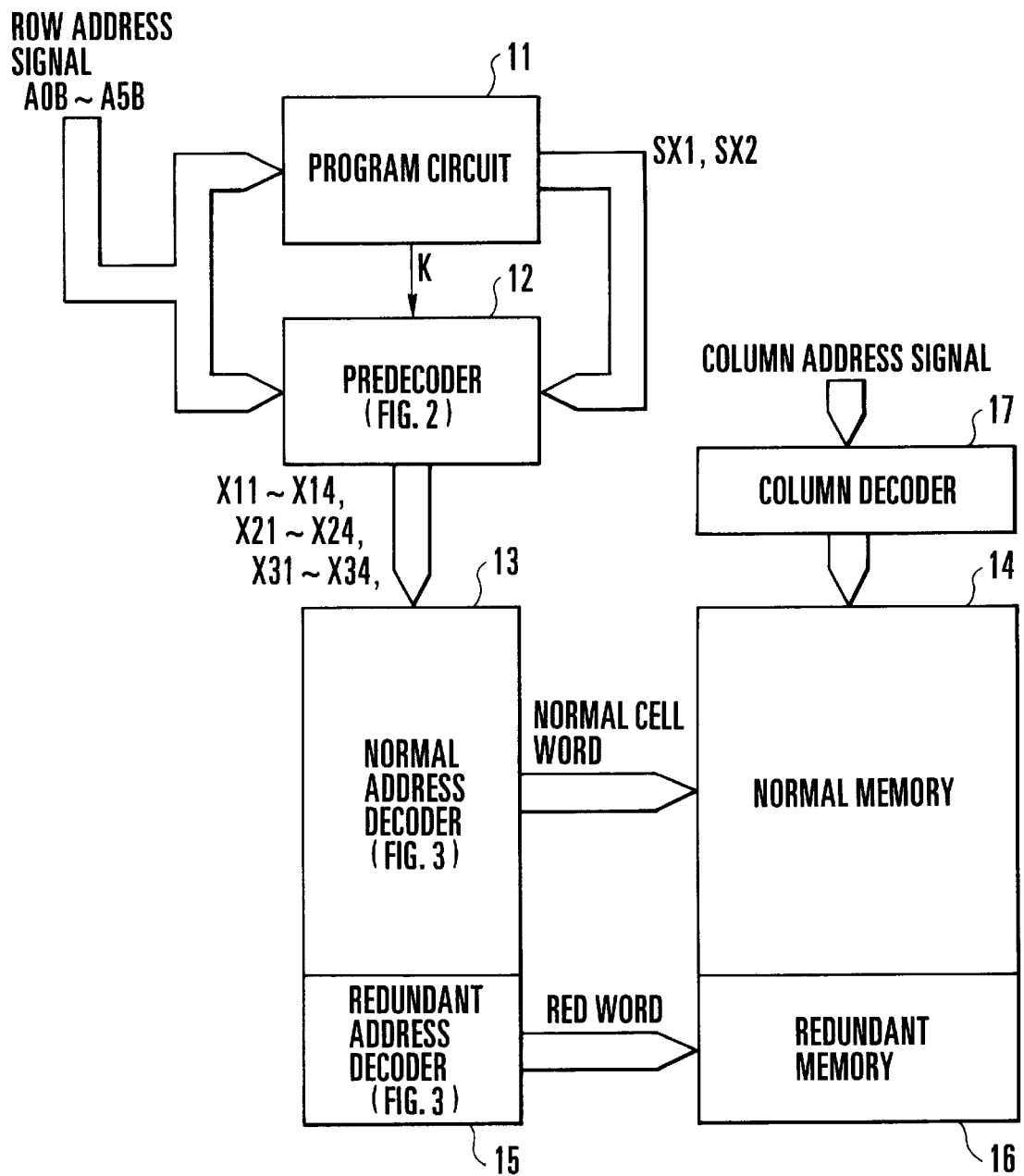
FIG. 1 is a block diagram showing the arrangement of a semiconductor memory device according to an embodiment of the present invention.

FIG. 1 shows a semiconductor memory device according to an embodiment of the present invention. The semiconductor memory device shown in FIG. 1 receives row address signal bits A0B to A5B and a column address signal supplied from a CPU (Central Processing Unit) or the like to select arbitrary normal memory cells in a normal memory in which a plurality of normal memory cells are arrayed in a matrix. In this case, semiconductor memory devices include all semiconductor memory devices storing information in memory cells, and more specifically, a ROM (Read Only Memory), a MOS (Metal Oxide Semiconductor) dynamic RAM (Random Access Memory), a static RAM, and the like.

In FIG. 1, a predecoder 12 decodes the row address signal bits A0B to A5B and outputs address selection signal bits X11 to X14, X21 to X24, and X31 to X34 to array interconnections (to be described later). A normal address decoder 13 and a redundant address decoder 15 output a normal cell word and a redundant cell (RED) word on the basis of the address selection signal bits X11 to X14, X21 to X24, and X31 to X34 obtained from the array interconnections to designate normal memory cell arrays of a normal memory 14 and redundant memory cell arrays of a redundant memory 16, which are arrayed in a matrix. A column decoder 17 designates columns (bit lines) of the normal and redundant memories on the basis of the column address signals, thereby designating memory cells in the memory cell arrays.

A defective normal memory cell generated in the normal memory 14 during the manufacturing process is found in a wafer test. A table indicating that an inactivating signal K called a killer signal is output in response to the row address signal bits A0B to A5B for selecting a defective normal memory cell, and simultaneously, redundant address selection signals SX1 and SX2 for selecting a redundant memory cell in place of the defective memory cell are output is programmed on a program circuit 11 by fuse cut.

More specifically, when a normal memory cell is to be selected, the killer signal K is set at "H" level while both the redundant address selection signals SX1 and SX2 are set at "L" level. When a redundant memory cell is to be selected, the killer signal K is set at "L" level while one of the redundant address selection signals SX1 and SX2 is set at "H" level in accordance with the address of the redundant memory cell to be selected. The killer signal K and the redundant address selection signals SX1 and SX2 are input to the predecoder 12.

As shown in FIG. 2, the predecoder 12 comprises three predecoder units 121 (A), 122 (B), and 123 (C). Each of the predecoder units 121 to 123 receives two bits of the six row address signal bits A0B to A5B and outputs the four address selection signal bits X11 to X14, X21 to X24, or X31 to X34 to the normal address decoder 13 and the redundant address decoder 15 through the array interconnections.

Figure 3:
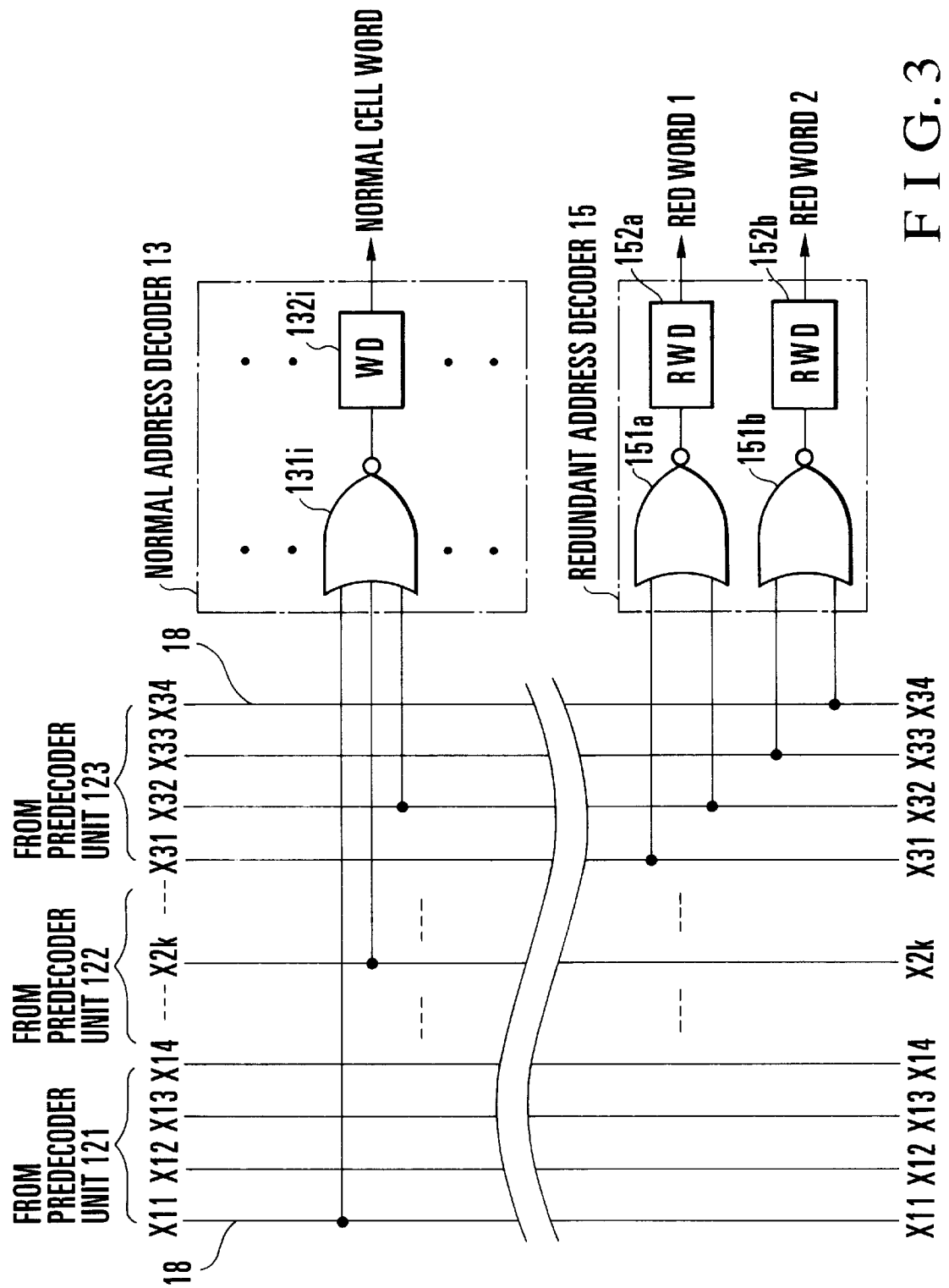
FIG. 3 is a block diagram showing the arrangements of a normal address decoder and a redundant address decoder shown in FIG. 1 and their relationship with an interconnection array.

FIG. 3 shows the arrangements of the normal address decoder 13 and the redundant address decoder 15 and their relationship with the array interconnections. The normal address decoder 13 is constituted by a plurality of logic (NOR) gates 131*i* corresponding to the row addresses (words) of the normal memory 14 and normal memory cell word drivers (WD) 132*i*. Each logic gate 131*i* receives one of the four address selection signal bits X11 to X14, X21 to X24, or X31 to X34 from each of the predecoder units 121 to 123 and NORs the received signals to drive the corresponding normal memory cell word driver 132*i*.

The redundant address decoder 15 selects a redundant memory cell array on the basis of the address selection signal bits X31 to X34 obtained from the predecoder unit 123. More specifically, as shown in FIG. 3, each of logic (NOR) gates 151*a* and 151*b* constituting the redundant address decoder 15 NORs the address selection signal bits X31 and X32 or X33 and X34 to drive redundant memory cell word drivers (RWD) 152*a* and 152*b*.

To realize redundant address selection, the semiconductor memory device having the above arrangement has, in the predecoder 12, an arithmetic circuit (to be described later) which determines selection of the normal memory cell or the redundant memory cell on the basis of the killer signal K (inactivating signal) and calculates the logic between the killer signal K and the redundant memory cell selection signals SX1 and SX2 to output a predetermined address selection signal corresponding to the redundant memory cell selection signal to the array interconnections.

Figure 7A:
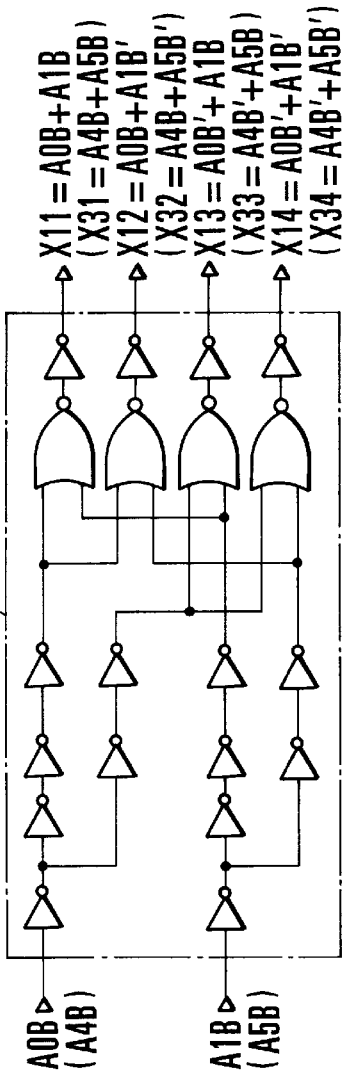
FIG. 7A is a block diagram of a predecoder unit (A) shown in FIG. 6.

The operation of the predecoder 12 will be described next. As shown in FIG. 2, of the three predecoder units 121 to 123, the predecoder units 122 and 123 receive the killer signal K from the program circuit 11. The predecoder unit 123 also receives the redundant address selection signals SX1 and SX2 in addition to the killer signal K. The arrangements of the predecoder units 121 and 122 are the same as those of the conventional circuit shown in FIGS. 7A and 7B, respectively.

More specifically, the predecoder unit 121 outputs the four address selection signal bits X11 to X14 on the basis of the row address signal bits A0B and A1B. At this time, one of the address selection signal bits X11 to X14 is at "L" level while the remaining three are at "H" level.

Figure 7B:
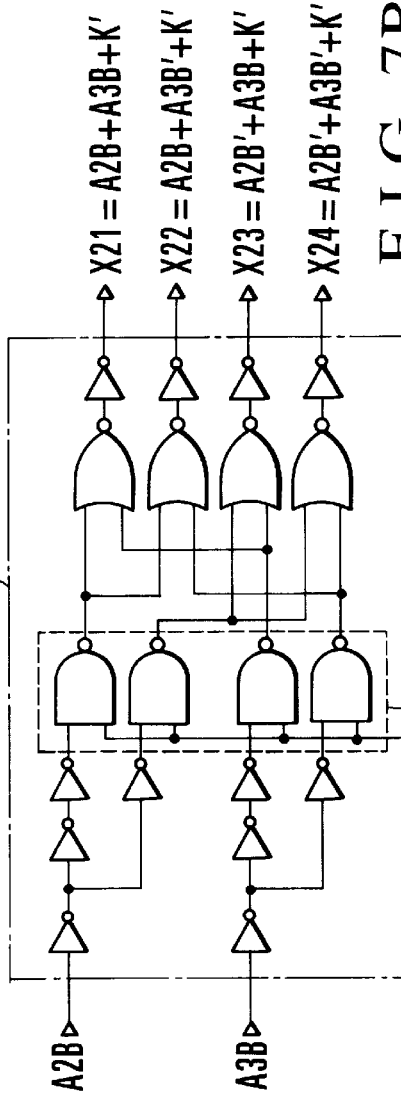
FIG. 7B is a block diagram of a predecoder unit (B) shown in FIG. 6.
Figure 8:
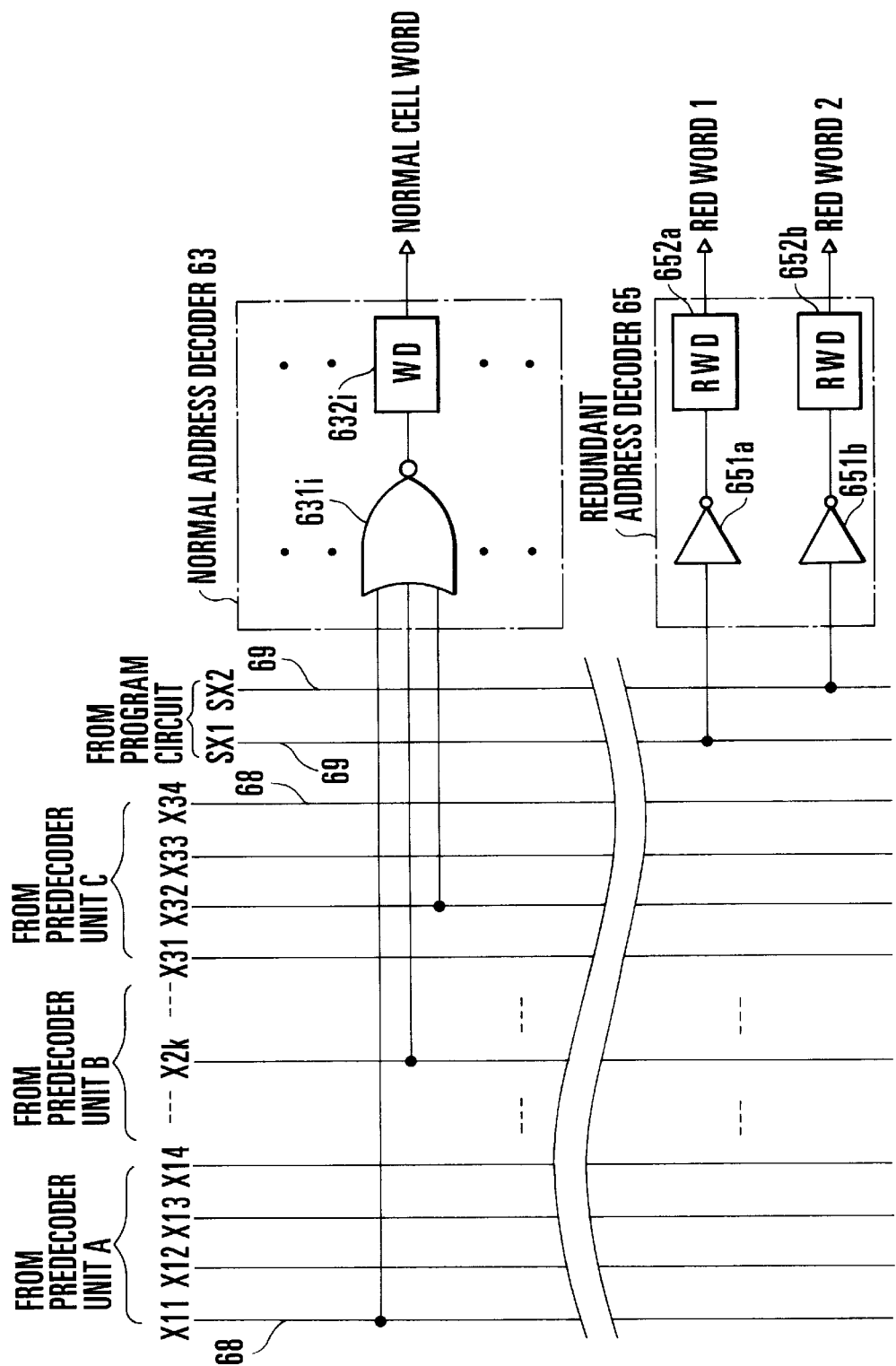
FIG. 8 is a block diagram showing the arrangements of a normal address decoder and a redundant address decoder shown in FIG. 5 and their relationship with array interconnections.

As show in FIG. 7B, the predecoder unit 122 realizes an arithmetic circuit 622a for determining selection of the normal memory 14 or the redundant memory 16 on the basis of the killer signal K using a plurality of NAND gates. When the killer signal K is at "H" level, i.e., the normal memory cell is to be selected, the arithmetic circuit 622a outputs the address selection signal bits X21 to X24 (one is at "L" level while the remaining three are at "H" level) determined by the row address signal bits A2B and A3B. However, when the killer signal K is at "L" level, i.e., the normal memory is to be inactivated, the arithmetic circuit 622a sets all the address selection signal bits X21 to X24 at "H" level.

One of the address selection signal bits X21 to X24 is input to all the logic gates 131i of the normal address decoder 13. For this reason, when the killer signal K of "L" level is output from the program circuit 11, no normal memory cell word is output from the normal address decoder 13, so the normal memory 14 can be inactivated.

Figure 4:
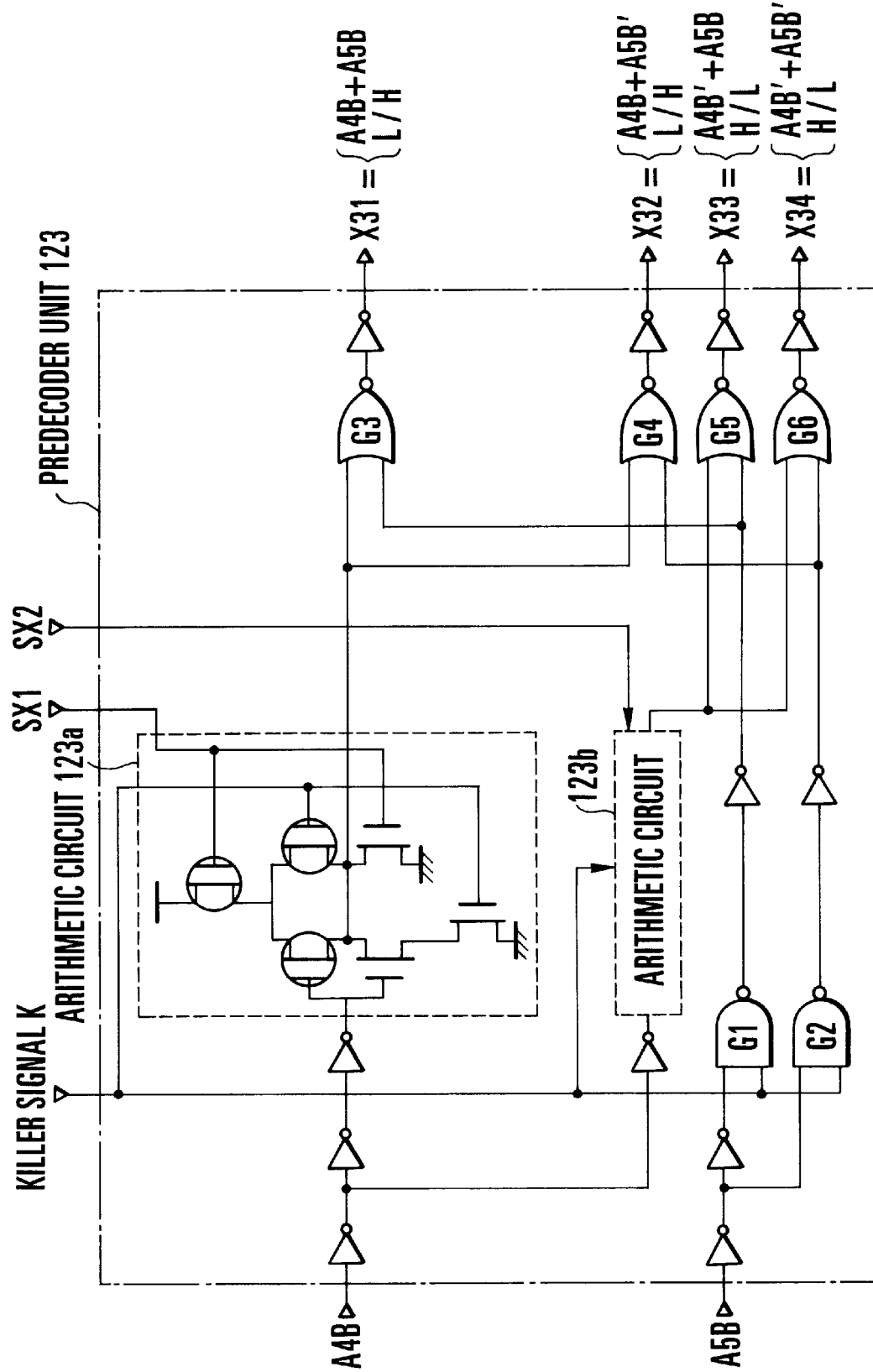
FIG. 4 is a circuit diagram of a predecoder unit (C) shown in FIG. 2.
Figure 5:
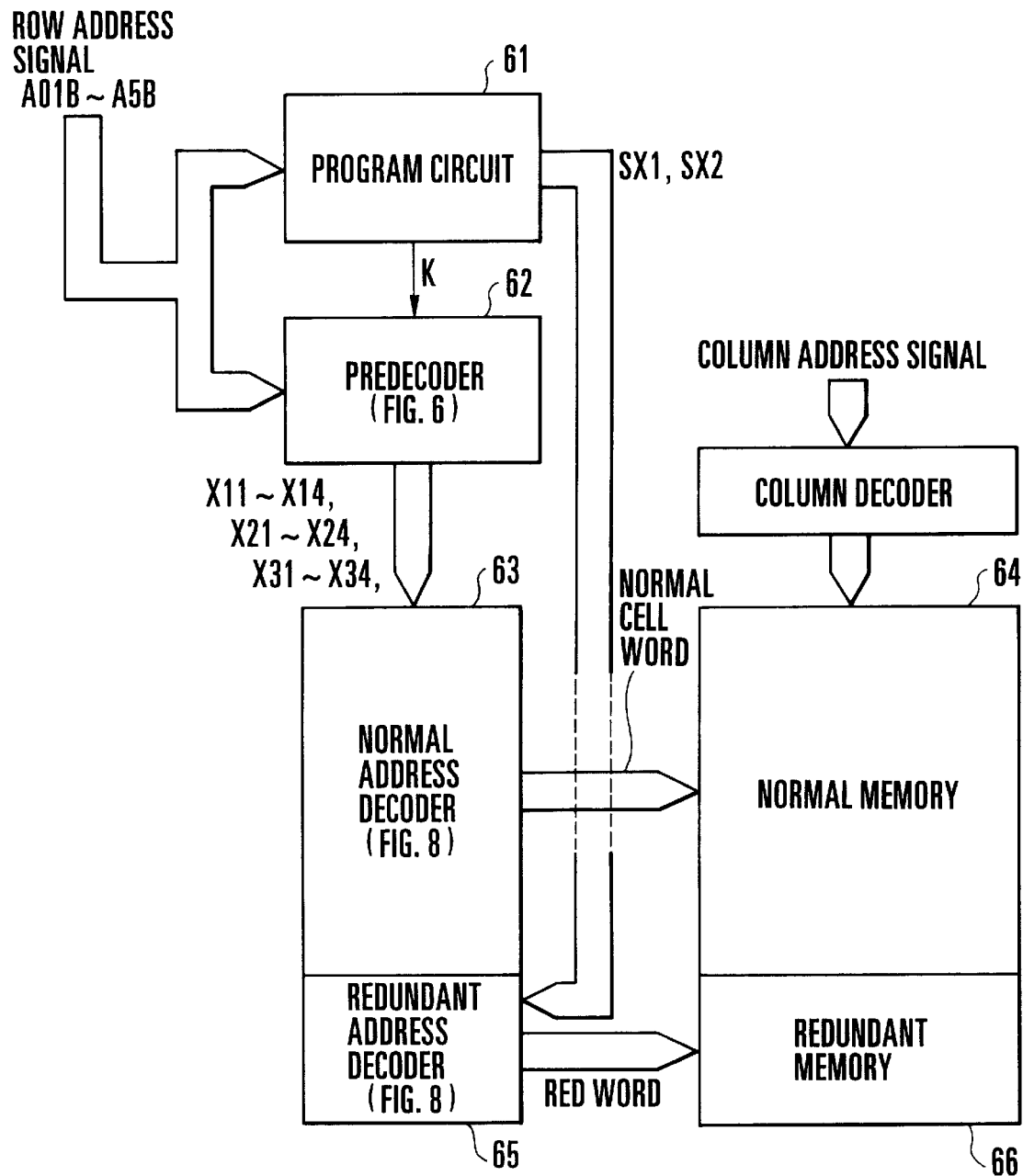
FIG. 5 is a block diagram of a conventional semiconductor memory device having a redundant memory.
Figure 6:
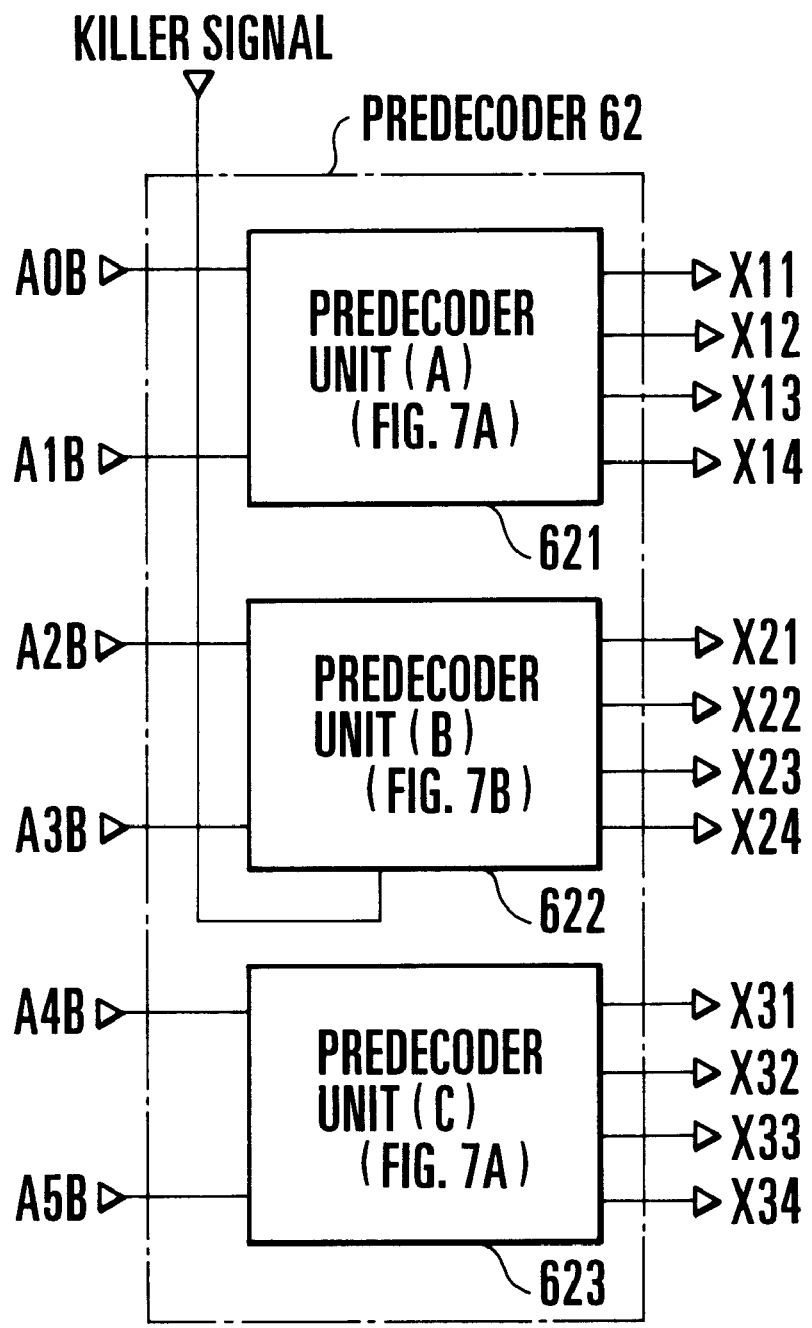
FIG. 6 is a block diagram of a predecoder shown in FIG. 5.

FIG. 4 shows the predecoder unit 123. Referring to FIG. 4, the predecoder unit 123 has, in addition to the plurality of logic gates for decoding the row address signal bits A4B and A5B, an arithmetic circuit 123a for calculating the logic between the killer signal K and the redundant address selection signal SX1, and an arithmetic circuit 123b for calculating the logic between the killer signal K and the redundant address selection signal SX2. Each of the two arithmetic circuits 123a and 123b has the same circuit arrangement as that constituted by six MOS transistors except that they receive the redundant address selection signals SX1 and SX2. In FIG. 4, the circuit arrangement of the arithmetic circuit 123b is not illustrated.

The operation of the arithmetic circuits 123a and 123b will be described next. When the killer signal K is at "H" level (when the normal memory cell is to be selected), the arithmetic circuits 123a and 123b operate as inverters for the row address signal bit A4B. In addition, the killer signal K is input to NAND gates G1 and G2 together with the row address signal bit A5B and the inverted signal bit A5B, respectively. For this reason, when the killer signal K is at "H" level (when the normal memory cell is to be selected), the NAND gates G1 and G2 operate as inverters for the address signal bit A5B and the inverted signal bit A5B. As a result, when the normal memory cell is to be selected, the predecoder unit 123 outputs the address selection signal bits X31 to X34 in correspondence with the row address signal bits A4B and A5B, one of which is at "L" level while remaining three are at "H" level.

To the contrary, when the killer signal K is at "L" level (when the redundant memory cell is to be selected), NMOS transistors in the arithmetic circuits 123a and 123b are turned off in response to the killer signal K to block the address signal bit A4B. Simultaneously, PMOS transistors are turned on, so the arithmetic circuits 123a and 123b operate as inverters for the redundant address selection signals SX1 and SX2, respectively. The arithmetic circuit 123a outputs a signal of "H" level when the redundant address selection signal SX1 is at "L" level and the redundant address selection signal SX2 is at "H" level, thereby closing NOR gates G3 and G4 (the address selection signals X31 and X32 are at "H" level). The arithmetic circuit 123b outputs a signal of "H" level when the redundant address selection signal SX1 is at "H" level and the redundant address selection signal SX2 is at "L" level, thereby closing NOR gates G5 and G6 (the address selection signal bits X33 and X34 are at "H" level).

In the predecoder unit 123, the killer signal K of " "L is input to the NAND gates G1 and G2 together with the row address signal bit A5B and the inverted signal bit A5B, respectively, so the NAND gates G1 and G2 are disabled. As a result, when the redundant memory cell is to be selected, the row address signal bits A4B and A5B are blocked by the arithmetic circuits 123a and 123b and the NAND gates G1 and G2, and one of the address selection signal bits X31 and X32 or X33 and X34 changes to "H" level or "L" level in accordance with the redundant address selection signals SX1 and SX2.

As shown in FIG. 3, the redundant address decoder 15 receives the address selection signal bits X31 to X34 having the above logic through array interconnections 18 and outputs a redundant memory cell word for selecting a predetermined redundant memory cell array.

The table below shows the logic and operation of each signal in the semiconductor memory device of this embodiment.

TABLE

|  | When a normal cell word is to be selected | When RED word 1 is to be selected | When RED word 2 is to be selected |
| --- | --- | --- | --- |
| Killer signal | H | L | L |
| SX1 | L | H | L |
| SX2 | L | L | H |
| X11 to X14 | One is at "L", and the remaining three are at "H" | One is at "L", and the remaining three are at "H" | One is at "L", and the remaining three are at "H" |
| X21 to X24 | One is at "L", and the remaining three are at "H" | All are at "H" | All are at "H" |
| X31 to X34 | One is at "L", and the remaining three are at "H" | X31 and X32 are at "L", and X33 and X34 are at "H" | X31 and X32 are at "H", and X33 and X34 are at "L" |
| Normal cell word | H | L | L |
| RED word 1 | L | H | H |
| RED word 2 | L | L | H |

In the semiconductor memory device of this embodiment, the predecoder 12 constituted by the three predecoder units 121 to 123 decodes the row address signal bits A0B to A5B and outputs the 12 address selection signal bits X11 to X14, X21 to X24, and X31 to X34 to the array interconnections 18. The predecoder unit 122 has the arithmetic circuit 622a for receiving the killer signal K, and when a redundant memory cell is to be selected, outputs the address signal bits X21 to X24 for inactivating the normal memory 14 to the normal address decoder 13.

The predecoder unit 123 has the arithmetic circuits 123a and 123b for receiving the killer signal K and the redundant address selection signals SX1 and SX2 and outputs the predetermined address selection signal bits X31 to X34 in the normal memory cell selection mode or in the redundant memory cell selection mode to the normal address decoder 13 and the redundant address decoder 15 through the array interconnections. The redundant address decoder 15 outputs a redundant memory cell (RED) word for selecting a predetermined redundant memory cell array on the basis of the address selection signal bits X31 to X34.

With this arrangement, in this embodiment, no special interconnections for the redundant address selection signals SX1 and SX2 need be arranged as the array interconnections 18, so the number of the array interconnections 18 can be reduced as compared to the prior art. Therefore, the chip area can be made smaller than that of the prior art, and the degree of freedom in layout of the semiconductor memory device can be increased.

In the above-described embodiment, the row address signal is a 6-bit signal, and the address selection signal is a 12-bit signal. However, the number of bits of the address signal or address selection signal of the present invention is not limited to this.

The predecoder 12 is constituted by the three predecoder units 121 to 123. However, the predecoder of the present invention is not limited to this. When the number of bits of the address signal increases, the predecoder may be constituted by four or more predecoder units, as a matter of course. Alternatively, a single multiple-input/multiple-output predecoder may be used as far as redundant address selection signals can be represented.

Each of the predecoder units 121 to 123 has a two-input/four-output structure. However, the number of inputs/outputs poses no problem as far as address signal decoding is concerned.

In the predecoder unit, and more particularly, the predecoder unit 123 shown in FIG. 4, each of the arithmetic circuits 123a and 123b is constituted by six MOS transistors. However, this is merely an example, and the circuit arrangement of the arithmetic circuit of the present invention is not limited to this.

As has been described above, according to the present invention, when a redundant memory cell is to be selected instead of a defective normal memory cell, the arithmetic means for calculating the logic of the inactivating signal output from the program circuit and the redundant address signal is arranged in the predecoder, and the address selection signals used to select the redundant memory cell are input to the redundant address decoder through the array interconnection. For this reason, no independent interconnections for the redundant address selection signals need be arranged.

Therefore, in the semiconductor memory device of the present invention, the degree of freedom in layout of memories and decoders increases, and simultaneously, the chip size can be made smaller than that of the prior art.

In addition, each address selection signal for inactivating the normal memory is output from one of the predecoder units constituting the predecoder in accordance with the inactivating signal, and the arithmetic means for calculating the logic between the inactivating signal and the redundant address signals is arranged in one of the remaining decoder units. With this arrangement normal memory inactivation in designating the redundant address, and redundant address designation are performed by different predecoder units. Therefore, device having the redundant memory, and more particularly, the predecoder can be easily designed.

What is claimed is:

1. A semiconductor memory device comprising:

a normal memory constituted by a plurality of normal memory cells;

a redundant memory constituted by a plurality of redundant memory cells a predecoder for decoding an address signal and outputting a corresponding address selection signal to an array interconnection;

a normal address decoder for selecting a normal memory cell in said normal memory on the basis of an address selection signal sent from said predecoder through said array interconnection;

a redundant address decoder for selecting a redundant memory cell in said redundant memory on the basis of an address selection signal sent from said predecoder through said array interconnection; and control means for, when a defective normal memory cell in said normal memory is designated by the address signal, outputting to said predecoder, an inactivating signal for inactivating said normal memory and a redundant memory cell selection signal for selecting said redundant memory cell in said redundant memory in place of said defective normal memory cell in said normal memory, wherein:

said predecoder outputs an address selection signal corresponding to the redundant memory cell selection signal from said control means to said array interconnection of the basis of the inactivating signal and the redundant memory cell selection signal from said control means, said predecoder comprises at least first and second predecoder units for receiving predetermined bit signals formed by dividing the address signal constituted by a plurality of bit signals, and outputting the address selection signals to first and second interconnections constituting said array interconnections, said first predecoder unit comprising first arithmetic means for determining selection of said normal memory or said redundant memory upon receiving the inactivating signal from control means, outputting an address selection signal corresponding to the address signal to said first interconnection of said array interconnections when said normal memory is to be selected, and outputting an address selection signal for inactivating said normal memory to said first interconnection of said array interconnections when said redundant memory is to be selected, and said second predecoder unit comprising second arithmetic means for determining selection of said normal memory or said redundant memory upon receiving the inactivating signal and the redundant memory cell selection signals from said control means, outputting an address selection signal corresponding to the address signal to said second interconnection of said array interconnections when said normal memory is to be selected, and outputting an address selection signal corresponding to the redundant memory cell selection signals to said second interconnection of said array interconnections on the basis of the logic between the inactivating signal and the redundant memory cell selection signals from said control means when said redundant memory is to be selected.

2. A device according to claim 1, wherein said normal address decoder is connected to said array interconnections and inactivate said normal memory on the basis of the address selection signal output from said first predecoder unit when said redundant memory is to be selected, and said redundant address decoder is connected to said second interconnection of said array interconnections and selects said redundant memory cell on the basis of the address selection signal output from said second predecoder unit when said redundant memory is to be selected.

3. A device according to claim 1, wherein said first arithmetic means comprises a plurality of logic gates for passing/blocking each predetermined bit signal and an inverted bit signal of the address signal in accordance with the inactivating signal from said control means, and said second arithmetic means comprises a plurality of logic units for switching each predetermined bit signal and an inverted bit signal of the address signal and the redundant memory cell selection signal from said control means in accordance with the inactivating signal from said control means, and outputting the selected signal.

4. A device according to claim 1, wherein said predecoder comprises a third predecoder unit for receiving a predetermined bit signal of the address signal constituted by a plurality of bit signals and outputting the address selection signal to a third interconnection constituting said array interconnections, and said normal address decoder is connected to said array interconnections constituted by said first to third interconnections.

* * * * *